United States Patent
Sung et al.

(10) Patent No.: US 11,785,786 B2
(45) Date of Patent: Oct. 10, 2023

(54) TRENCH FORMATION SCHEME FOR PROGRAMMABLE METALLIZATION CELL TO PREVENT METAL REDEPOSIT

(71) Applicant: Taiwan Semiconductor Manufacturing Company, Ltd., Hsin-Chu (TW)

(72) Inventors: Fu-Ting Sung, Yangmei (TW); Chung-Chiang Min, Zhubei (TW); Yuan-Tai Tseng, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/748,601

(22) Filed: May 19, 2022

(65) Prior Publication Data
US 2022/0278170 A1    Sep. 1, 2022

Related U.S. Application Data

(62) Division of application No. 16/408,898, filed on May 10, 2019, now Pat. No. 11,342,379.

(51) Int. Cl.
*H01L 21/02* (2006.01)
*H10B 63/00* (2023.01)
(Continued)

(52) U.S. Cl.
CPC .............. *H10B 63/00* (2023.02); *G11C 5/06* (2013.01); *G11C 13/0011* (2013.01); *H10N 70/245* (2023.02); *H10N 70/823* (2023.02)

(58) Field of Classification Search
CPC ........ H10B 63/00; H10B 63/80; H10B 63/30; G11C 5/06; G11C 13/0011; G11C 13/003;
(Continued)

(56) References Cited

U.S. PATENT DOCUMENTS 6,281,535 B1    8/2001 Ma et al.
9,799,705 B1   10/2017 Yi et al.
(Continued)

FOREIGN PATENT DOCUMENTS

CN          104425715 A     3/2015

OTHER PUBLICATIONS

Non-Final Office Action dated Jun. 11, 2020 for U.S. Appl. No. 16/408,898.
(Continued)

*Primary Examiner* — Samuel Park
(74) *Attorney, Agent, or Firm* — Eschweiler & Potashnik, LLC (57) ABSTRACT

Some embodiments relate to a method for forming a memory device. The method includes forming a lower dielectric layer over a conductive wire. A stack of memory layers is formed within the lower dielectric layer and over the conductive wire. The stack of memory layers comprises a top electrode, a bottom electrode, and a data storage layer between the top electrode and the bottom electrode. A removal process is performed on the stack of memory layers to define a programmable metallization cell that comprises the top electrode, the bottom electrode, and the data storage layer. The programmable metallization cell comprises a central region and a peripheral region that extends upwardly from the central region. A top surface of the programmable metallization cell and a top surface of the lower dielectric layer are coplanar.

20 Claims, 8 Drawing Sheets

(51) Int. Cl.
    *G11C 5/06*           (2006.01)
    *G11C 13/00*         (2006.01)
    *H10N 70/20*        (2023.01)
    *H10N 70/00*        (2023.01)

(58) Field of Classification Search
    CPC ............ G11C 2213/79; H10N 70/245; H10N 70/823; H10N 70/063; H10N 70/826; H10N 70/883; H10N 70/8833; H10N 70/20; H10N 70/011; H10N 70/801
    See application file for complete search history.

(56) References Cited

U.S. PATENT DOCUMENTS

| | | | |
|---|---|---|---|
| 2002/0109175 A1* | 8/2002 | Iwamoto | H01L 27/0248 257/E21.394 |
| 2003/0190820 A1* | 10/2003 | Hill | H01L 21/288 438/785 |
| 2005/0082637 A1* | 4/2005 | Mikawa | H01L 21/7687 257/532 |
| 2007/0212845 A1 | 9/2007 | Lin et al. | |
| 2008/0132068 A1* | 6/2008 | Pangrle | H10N 70/20 257/E21.648 |
| 2011/0233696 A1 | 9/2011 | Li | |
| 2016/0013245 A1* | 1/2016 | Boivin | H10N 50/80 438/238 |
| 2017/0148849 A1 | 5/2017 | Chuang et al. | |
| 2017/0279036 A1 | 9/2017 | Mo et al. | |
| 2017/0338279 A1 | 11/2017 | Yang et al. | |
| 2020/0119088 A1 | 4/2020 | Hashemi et al. | |
| 2020/0161236 A1 | 5/2020 | Kim et al. | |

OTHER PUBLICATIONS

Final Office Action dated Dec. 28, 2020 for U.S. Appl. No. 16/408,898.
Non-Final Office Action dated Apr. 7, 2021 for U.S. Appl. No. 16/408,898.
Final Office Action dated Sep. 29, 2021 for U.S. Appl. No. 16/408,898.
Notice of Allowance dated Jan. 26, 2022 for U.S. Appl. No. 16/408,898.

* cited by examiner

TRENCH FORMATION SCHEME FOR PROGRAMMABLE METALLIZATION CELL TO PREVENT METAL REDEPOSIT

REFERENCE TO RELATED APPLICATION

This application is a Divisional of U.S. application Ser. No. 16/408,898, filed on May 10, 2019, the contents of which are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Programmable metallization cell (PMC) random access memory (RAM), which may also be referred to as conductive bridging RAM, CBRAM, Nanobridge, or electrolytic memory, is one promising candidate for next generation non-volatile electronic memory due to advantages over current electronic memory. Compared to current non-volatile memory, such as flash random-access memory, PMCRAM typically has better performance and reliability. Compared to current volatile memory, such as dynamic random-access memory (DRAM) and static random-access memory (SRAM), PMCRAM typically has better performance and density, with lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A programmable metallization cell generally includes a data storage layer arranged between a top electrode and a bottom electrode. When a set voltage is applied across the top and bottom electrodes, a conductive bridge is formed within the data storage layer (resulting in a low resistance state). When a reset voltage is applied across the top and bottom electrodes, the conductive bridge is erased within the data storage layer (resulting in a high resistance state).

During fabrication of the programmable metallization cell, a memory cell stack is formed over a substrate. The memory cell stack comprises a data storage layer disposed between a top electrode layer and a bottom electrode layer. A hard mask layer is formed over the top electrode layer. Separate etch processes are subsequently performed to define top and bottom electrodes. For example, a first etch process (e.g., a first plasma etch process) is performed to define a top electrode by patterning the top electrode layer. During the first etch process, material (e.g., titanium nitride) from the top electrode layer will re-deposit onto sidewalls of the hard mask layer. During a second etch process (e.g., a second plasma etch process) used to define the bottom electrode, material from the top electrode and/or the bottom electrode layer may be etched and redistributed onto sidewalls of the data storage layer. Since the material is conductive, the material may electrically short the top and bottom electrodes, thereby rendering the programmable metallization cell inoperable. Additionally, a wet clean process (e.g., using cleaning solution(s) such as hydrofluoric acid and/or deionized water) utilized after the separate etch processes (e.g., to reduce the re-deposited conductive material) may damage an interface(s) between the top and/or bottom electrode and the data storage layer, thereby leading to peeling between the layers. This, in part, may impair a stability, endurance, and/or switching time of the programmable metallization cell.

In some embodiments of the present disclosure, to eliminate the re-deposition of material from the top electrode and/or bottom electrode layer onto sidewalls of the memory cell stack, the memory cell stack may be formed by a planarization process (e.g., a chemical-mechanical planarization (CMP) process) instead of separate etch processes. In such embodiments, a dielectric layer is formed over a conductive wire and a masking layer is formed over outer regions of the dielectric layer. An etch process is performed to define an opening in the dielectric layer directly above a center portion of the conductive wire. The memory cell stack is formed within the opening such that an upper surface of the memory cell stack is recessed below a top surface of the dielectric layer. A planarization process is performed on the memory cell stack until the top surface of the dielectric layer is reached, thereby defining a programmable metallization cell. By virtue of the planarization process, layers within the programmable metallization cell respectively have a U-shaped profile. After forming the programmable metallization cell, the wet clean process (e.g., the wet clean process described above) is performed on the programmable metallization cell. The U-shaped profile of the layers in the programmable metallization cell mitigates and/or prevents peeling between the layers. The memory cell stack is not formed by a plasma etch process, thereby mitigating and/or eliminating a re-deposition of conductive material on the top and/or bottom electrodes. Thus, this method facilities formation of the programmable metallization cell without etching the memory cell stack, and thereby prevents the top and bottom electrodes from being shorted together. Additionally, replacing the separate etch processes with the planarization process reduces costs and time associated with forming the programmable metallization cell, and mitigates peeling at the interface(s) between the top and/or bottom electrode and the data storage layer. This, in part, increases a stability, endurance, and/or switching time of the programmable metallization cell.

Figure 1:
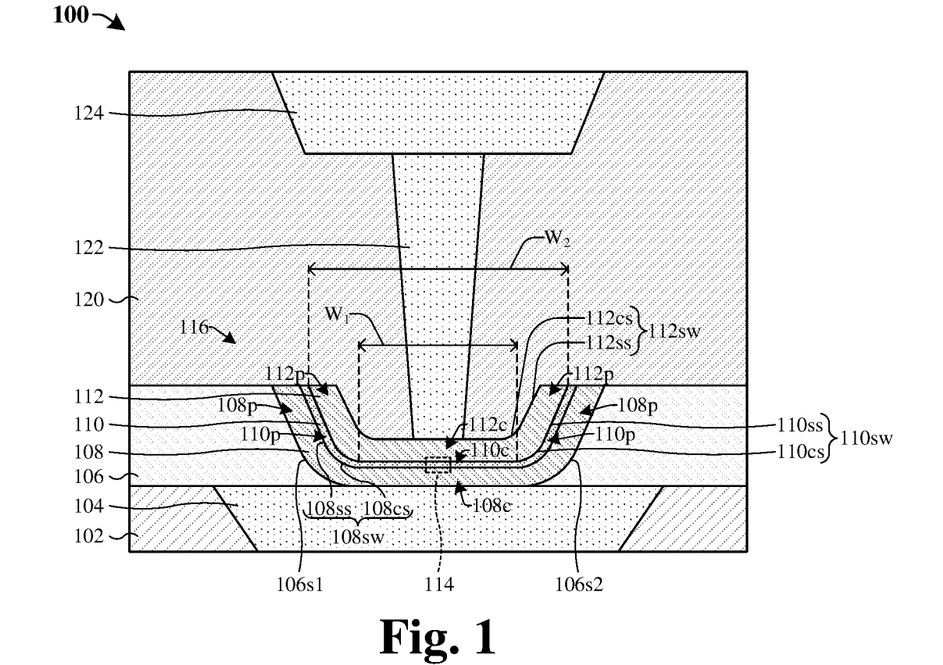
FIG. 1 illustrates a cross-sectional view of some embodiments of a memory device including a programmable metallization cell.

Referring to FIG. 1, a cross-sectional view of some embodiments of a memory device 100 including a memory cell 116 is provided.

The memory cell 116 includes a bottom electrode 108 and a top electrode 112, with a data storage layer 110 (in some embodiments, also known as an insulator layer or an electrolyte) disposed between the top and bottom electrode 112, 108. The memory cell 116 is disposed within a bottom dielectric layer 106, such that a top surface of the memory cell 116 is aligned with a top surface of the bottom dielectric layer 106, and a bottom surface of the memory cell 116 is aligned with a bottom surface of the bottom dielectric layer 106. In some embodiments, the memory cell 116 is configured as a programmable metallization cell (PMC) random access memory (RAM), which may also be referred to as conductive bridging RAM, CBRAM, Nanobridge, or electrolytic memory.

The memory cell 116 is often disposed over an inter-level dielectric (ILD) layer 102 with a bottom conductive wire 104 disposed within the ILD layer 102. The bottom conductive wire 104 electrically couples the bottom electrode 108 to underlying metal layers and/or complementary metal-oxide-semiconductor (CMOS) devices (e.g., transistors, diodes, etc.) that may overlie a semiconductor substrate (not shown). A conductive via 122 overlies the top electrode 112, and electrically couples the top electrode 112 to upper conductive layers (e.g., an upper conductive wire 124. The conductive via 122 extends through an upper ILD structure 120. The upper conductive wire 124 extends past sidewalls of the conductive via 122 and may be electrically coupled to an overlying bit line (not shown).

The bottom electrode 108 includes a central bottom electrode region 108c and a peripheral bottom electrode region 108p that extends upwardly from the central bottom electrode region 108c. Similarly, the data storage layer 110 and top electrode 112 include central regions 110c, 112c, respectively, over the bottom electrode central region 108c, and include peripheral regions 110p, 112p, respectively, over the bottom electrode peripheral region 108p.

In some embodiments, the bottom dielectric layer 106 has a pair of sidewalls 106s1, 106s2 that are in direct contact with outer sidewalls of the bottom electrode 108. The pair of sidewalls 106s1, 106s2 respectively have a slanted segment overlying a curved segment, such that sidewalls (e.g., outer sidewalls and/or inner sidewalls) of the bottom electrode 108 respectively have a slanted segment overlying a curved segment. Further, sidewalls (e.g., outer sidewalls and/or inner sidewalls) of the data storage layer 110 respectively have a slanted segment overlying a curved segment, and sidewalls (e.g., outer sidewalls and/or inner sidewalls) of the top electrode 112 respectively have a slanted segment overlying a curved segment. The bottom electrode 108 underlies and cups a bottom surface and outer sidewalls of the data storage layer 110. The data storage layer 110 underlies and cups a bottom surface and outer sidewalls of the top electrode 112. A top surface of the bottom electrode 108, a top surface of the data storage layer 110, a top surface of the top electrode 112, and a top surface of the bottom dielectric layer 106 are aligned. It may be appreciated, aligned as used herein contemplates that some small misalignments, such as due to tolerances (e.g., during a chemical-mechanical planarization (CMP) process used to form a device), may be present in the surfaces and/or parts of layers and/or structures that are aligned.

In some embodiments, the pair of sidewalls 106s1, 106s2, outer sidewalls of the bottom electrode 108, outer sidewalls of the data storage layer 110, and outer sidewalls of the top electrode 112 are defined from a cross-sectional view. For example, if when viewed from above the memory cell 116 is circular or elliptical then the pair of sidewalls 106s1, 106s2 is a single continuous sidewall when viewed from above, therefore the "pair" of sidewalls 106s1, 106s2 refers to the nature of this single continuous sidewall when depicted in in a cross-sectional view. Additionally, if when viewed from above the memory cell 116 is circular or elliptical then any length and/or width associated with a cross-sectional view of the layers comprising the memory cell 116 respectively correspond to diameters of a circle or lengths defined between two vertices on the major axis of an ellipse.

In some embodiments, an inner sidewall 112sw of the top electrode 112 has a slanted segment 112ss overlying a curved segment 112cs, such that a first width $W_1$ of the top electrode 112 is less than a second width $W_2$ of the top electrode 112. As seen in FIG. 1, the width of the top electrode 112 continuously increases from the first width $W_1$ to the second with $W_2$. Further, an inner sidewall 110sw of the data storage layer 110 has a slanted segment 110ss overlying a curved segment 110cs. Furthermore, an inner sidewall 108sw of the bottom electrode 108 has a slanted segment 108ss overlying a curved segment 108cs.

During operation, the memory cell 116 relies on redox reactions to form and dissolve a conductive bridge in a conductive bridge region 114 of the data storage layer 110 between the top and bottom electrodes 112, 108. The existence of a conductive bridge in conductive bridge region 114 between the top and bottom electrodes 112, 108 produces a low resistance state, while the absence of a conductive bridge in conductive bridge region 114 results in a high resistance state. Thus, the memory cell 116 can be switched between the high resistance state and low resistance state by applying appropriate biases between the top and bottom electrodes 112, 108 to produce or dissolve a conductive bridge in conductive bridge region 114.

In some embodiments, top and bottom electrodes 112, 108 are made of silver. In these and/or other embodiments, to facilitate this switching, one of the top or bottom electrodes 112, 108 is electrochemically inert, while the other is electrochemically active to help facilitate switching. For example, in some embodiments, the top electrode 112 can be relatively electrochemically inert and may comprise titanium nitride, tantalum nitride, silver, tantalum, titanium, platinum, nickel, hafnium, zirconium, and/or tungsten, among others; and/or the bottom electrode 108 can be electrochemically active and can be made of silver, copper, aluminum, or tellurium, among others. In other embodiments the compositions of the top and bottom electrodes 112, 108 can be flipped relative to what is described above, such that the top electrode 112 is electrochemically active and the bottom electrode 108 is inert. In some embodiments, the data storage layer 110 can manifest as a thin film of solid electrolyte, which is a solid material with highly mobile ions. For example, in some embodiments the data storage layer 110 can be made of hafnium oxide ($HfO_2$), zirconium oxide ($ZrO_2$), Aluminum oxide ($Al_2O_3$), amorphous silicon, or silicon nitride ($Si_3N_4$), among others.

Figure 2A:
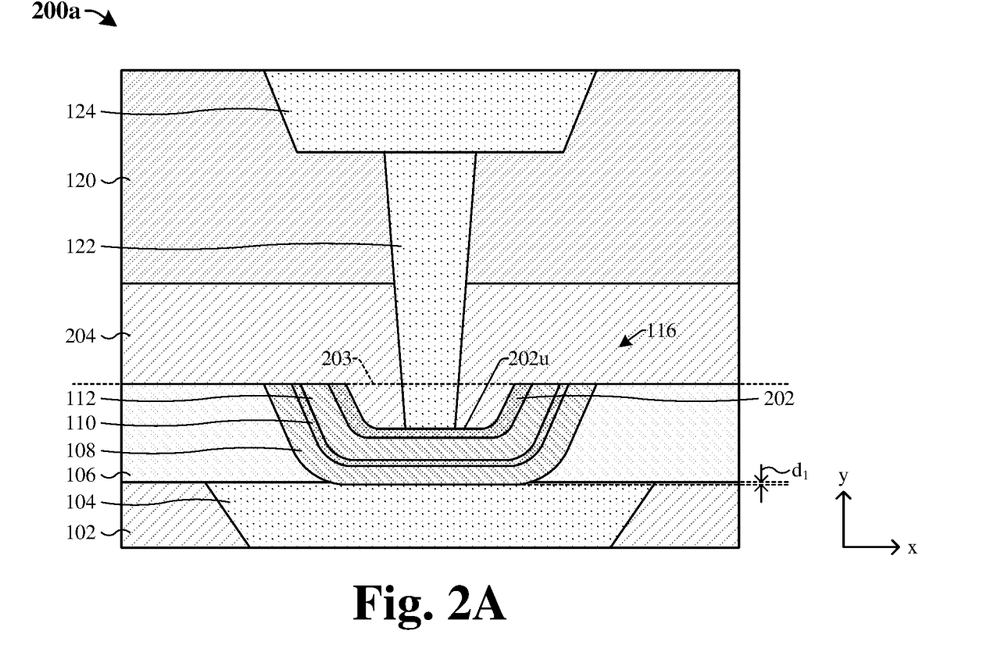
FIGS. 2A-2B and 3A-3B illustrate cross-sectional views of various alternative embodiments of the memory device of FIG. 1.

In some embodiments, such as illustrated in FIG. 2A which is described further herein, the top electrode 112 comprises a conductive barrier layer overlying an electrochemically inert or active layer. For example, in FIG. 1 the top electrode 112 may comprise a titanium nitride layer (i.e. conductive barrier layer) overlying a silver layer (i.e., electrochemically inert layer), such that the titanium nitride layer provides a stable interface for overlying conductive vias and/or wires (e.g., the conductive via 122). In some embodiments, if the conductive barrier layer (e.g., titanium nitride layer) is omitted and a conductive via and/or wire is disposed directly on the electrochemically inert or active layer (e.g., silver layer), then migration of the conductive material (e.g., silver) in the electrochemically inert or active layer may occur. This, in part, may cause a short circuit between the top and bottom electrodes 112, 108 and/or cause a non-ohmic contact between the overlying conductive vias and/or wires (e.g., the conductive via 122) and the top electrode 112.

By overlying the memory cell 116 along the pair of sidewalls 106s1, 106s2 of the bottom dielectric layer 106, a re-deposition of conductive material(s) from the top and/or bottom electrode 112, 108 to the data storage layer 110 is mitigated during fabrication of the memory cell 116. By mitigating the re-deposition of conductive material(s) from the top and/or bottom electrodes 112, 108, the top and bottom electrodes 112, 108 are not electrically shorted together by the conductive material(s), and thus the memory cell 116 can change between a high resistance state and a low resistance state.

Although FIG. 1 describes the memory cell 116 as being a programmable metallization cell (PMC) random access memory (RAM) cell, it will be appreciated that the memory cell 116 is not limited to such a device. Rather, in alternative embodiments, the memory cell 116 may be a phase-change random-access memory (PCRAM) cell, a resistive random-access memory (RRAM) cell, a magnetoresistive random-access memory (MRAM) cell, a spin-transfer torque magnetoresistive random-access memory (STT-MRAM) cell, or the like. In such embodiments, the memory cell 116 can be formed to have a top surface of a top electrode, a top surface of a bottom electrode, and a top surface of a data storage layer respectively aligned with a substantially straight horizontal line such that the top and bottom electrodes are not electrically coupled together (e.g., by re-deposited conductive materials).

Referring to FIG. 2A, a cross-sectional view of a memory device 200a according to some alternative embodiments of the memory device 100 of FIG. 1 is provided in which a conductive barrier layer 202 overlies the top electrode 112.

The memory device 200a includes a top dielectric layer 204 overlying the memory cell 116. The memory cell 116 comprises a conductive barrier layer 202 overlying a top electrode 112, and a data storage layer 110 disposed between the top electrode 112 and a bottom electrode 108. In some embodiments, the conductive barrier layer 202 is a part of the top electrode 112, such that the conductive barrier layer 202 is a topmost layer in the top electrode 112. The conductive barrier layer 202 is configured to prevent migration of a material (e.g., silver) from the top electrode 112 to the bottom electrode 108 (and/or to overlying metal layers), thereby mitigating electrical shorting between the top and bottom electrodes 112, 108 and/or preventing a non-ohmic contact with overlying metal layers (e.g., the conductive via 122). In further embodiments, a top surface of the conductive barrier layer 202, a top surface of the top electrode 112, a top surface of the data storage layer 110, a top surface of the bottom electrode 108, and a top surface of the bottom dielectric layer 106 are respectively aligned with a horizontal plane 203 (e.g., x-z plane). In further embodiments, the horizontal plane 203 is parallel with a top surface of an underlying semiconductor substrate (not shown). A bottom surface of the conductive via 122 is below the horizontal plane 203. An upper surface 202u of the conductive barrier layer 202 is below the horizontal plane 203. A lower portion of the top dielectric layer 204 extends below the horizontal plane 203. In further embodiments, the top surface of the conductive barrier layer 202, the top surface of the top electrode 112, the top surface of the data storage layer 110, the top surface of the bottom electrode 108, and the top surface of the bottom dielectric layer 106 are respectively in direct contact with a lower surface of the top dielectric layer 204. In some embodiments, a bottom surface of the bottom electrode 108 is recessed below a top surface of the bottom conductive wire 104 by a distance $d_1$ that may, for example, be within a range of about 1 to 130 Angstroms. In further embodiments the bottom surface of the bottom electrode 108 is aligned with the top surface of the bottom conductive wire 104, such that the distance $d_1$ is 0 Angstroms (not shown).

In some embodiments, the bottom dielectric layer 106 may be one or more dielectric layers and may, for example, be or comprise silicon nitride, silicon carbide, or the like with a thickness within a range of approximately 300 to 1000 Angstroms. In further embodiments, the bottom electrode 108 may be one or more conductive layers and may, for example, be or comprise silver, copper, aluminum, tellurium, or the like with a thickness within a range of approximately 75 to 300 Angstroms. In yet further embodiments, the data storage layer 110 may be one or more dielectric layers and may, for example, be or comprise hafnium oxide, zirconium oxide, aluminum oxide, tantalum oxide, another metal oxide, or the like with a thickness within a range of approximately 20 to 100 Angstroms. In some embodiments, the top electrode 112 may be one or more conductive layers and may, for example, be or comprise silver, copper, titanium nitride, tantalum nitride, or the like with a thickness within a range of approximately 100 to 600 Angstroms. In some embodiments, the conductive barrier layer 202 may be, for example, titanium nitride, tantalum nitride, or the like with a thickness within a range of approximately 10 to 200 Angstroms. In some embodiments, the top and bottom electrodes 112, 108 comprise a same conductive material (e.g., silver) different than a material (e.g., titanium nitride) the conductive barrier layer 202 is comprised of. In some embodiments, the bottom conductive wire 104, the conductive via 122, and the upper conductive wire 124 may, for example, be or comprise aluminum, copper, or the like. In yet further embodiments, the top dielectric layer 204 may be one or more dielectric layers and may, for example, be or comprise silicon nitride, silicon carbide, or the like with a thickness within a range of 300 to 1500 Angstroms. In some embodiments, the top dielectric layer 204 is a same material and/or combination of materials as the bottom dielectric layer 106. In yet further embodiments, the upper ILD structure 120 comprises one or more dielectric layers and may, for example, be or comprise silicon oxide, another oxide, a low-k dielectric, or the like with a thickness within a range of about 1250 to 2800 Angstroms. As used herein, a low-k dielectric is a dielectric material that has a dielectric constant less than 3.9.

Figure 2B:
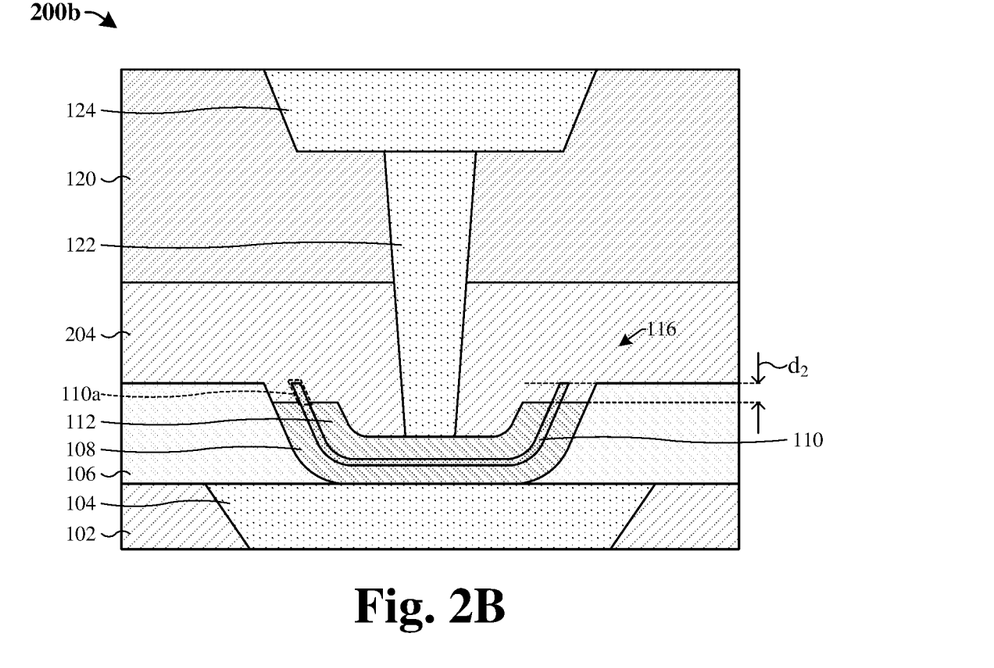

Referring to FIG. 2B, a cross-sectional view of a memory device 200b according to some alternative embodiments of the memory device 100 of FIG. 1 is provided in which a top surface of the top electrode 112 and a top surface of the bottom electrode 108 are recessed below a top surface of the data storage layer 110 by a distance $d_2$. An upper segment 110a of the data storage layer 110 is vertically above the top surfaces of the top and bottom electrodes 112, 108. This, in part, increases isolation between the top and bottom electrodes 112, 108, and thereby mitigates "leakage" (i.e., a flow of current) between the top and bottom electrodes 112, 108. By increasing isolation between the top and bottom electrodes 112, 108, an initial "leakage" of the memory cell 116 is reduced, and stability, endurance, and/or a set/reset voltage window of the memory cell 116 may be increased. In some embodiments, the top surface of the top electrode 112 is below the top surface of the bottom electrode 108, or vice versa (not shown). This, in part, may be due to an over etch of either the top or bottom electrode 112, 108 during formation of the memory device 200b (e.g., during an etch process used to from the recess).

In some embodiments, the distance $d_2$ is within a range of 20 to 200 Angstroms. In some embodiments, if the distance $d_2$ is greater than 20 Angstroms, then isolation between the top and bottom electrodes 112, 108 is increased, thus mitigating "leakage" between the top and bottom electrodes 112, 108. In further embodiments, if the distance $d_2$ is less than 200 Angstroms, then the top and/or bottom electrode 112, 108 are sufficiently large enough, such that the memory cell 116 has an enhanced stability, endurance, and/or switching time.

Figure 3A:
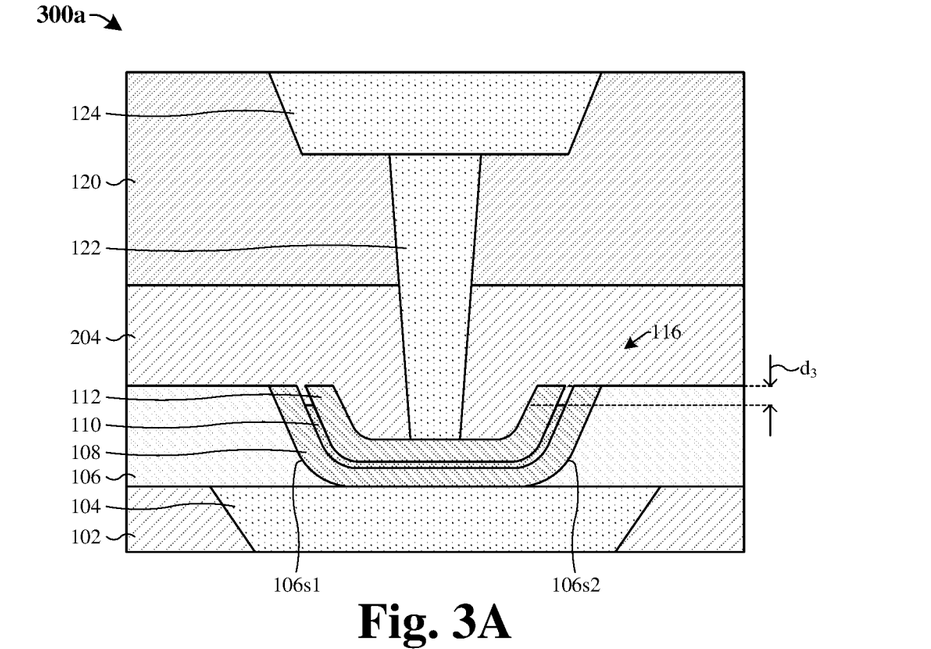

Referring to FIG. 3A, a cross-sectional view of a memory device 300a according to some alternative embodiments of the memory device 100 of FIG. 1 is provided in which a top surface of the data storage layer 110 is recessed below a top surface of the top electrode 112 and a top surface of the bottom electrode 108 by a distance $d_3$. This, in part, increases isolation between the top and bottom electrodes 112, 108, and thereby mitigates "leakage" between the top and bottom electrodes 112, 108. By increasing isolation between the top and bottom electrodes 112, 108, an initial "leakage" of the memory cell 116 is reduced, and stability, endurance, and/or a set/reset voltage window of the memory cell 116 may be increased. An upper segment of the top electrode 112 and an upper segment of the bottom electrode 108 are respectively above the top surface of the data storage layer 110. In some embodiments, the upper segments of the top and bottom electrodes 112, 108 are laterally separated from one another by the top dielectric layer 204. In further embodiments, a protrusion of the top dielectric layer 204 extends from the top surface of the top electrode 112 to the top surface of the data storage layer 110 by the distance $d_3$.

In some embodiments, the distance $d_3$ is within a range of 20 to 200 Angstroms. In some embodiments, if the distance $d_3$ is greater than 20 Angstroms, then isolation between the top and bottom electrodes 112, 108 is increased, thus mitigating "leakage" between the top and bottom electrodes 112, 108. In further embodiments, if the distance $d_3$ is less than 200 Angstroms, then the top and/or bottom electrode 112, 108 are sufficiently large enough, such that the memory cell 116 has an enhanced stability, endurance, and/or switching time.

Figure 3B:
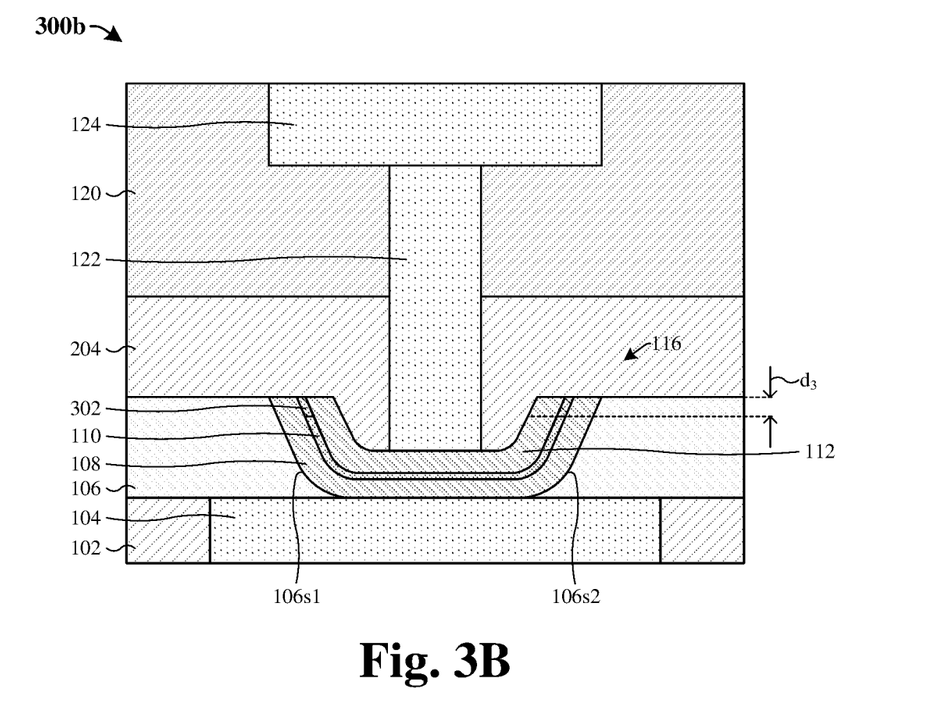

Referring to FIG. 3B, a cross-sectional view of a memory device 300b according to some alternative embodiments of the memory device 300a of FIG. 3A is provided in which the upper segments of the top and bottom electrodes 112, 108 are laterally separated from one another by a filling dielectric layer 302. In some embodiments, the filling dielectric layer 302 may, for example, be or comprise silicon nitride, silicon carbide, or the like. In some embodiments, the filling dielectric layer 302 extends from the top surface of the top electrode 112 to the top surface of the data storage layer 110 by the distance $d_3$. In yet further embodiments, the filling dielectric layer 302 comprises a material different than the bottom dielectric layer 106 and/or the top dielectric layer 204. In yet further embodiments, the filling dielectric layer 302 is omitted and a space occupied by the filling dielectric layer 302 is filled with empty space (e.g., air) (not shown).

Figure 4:
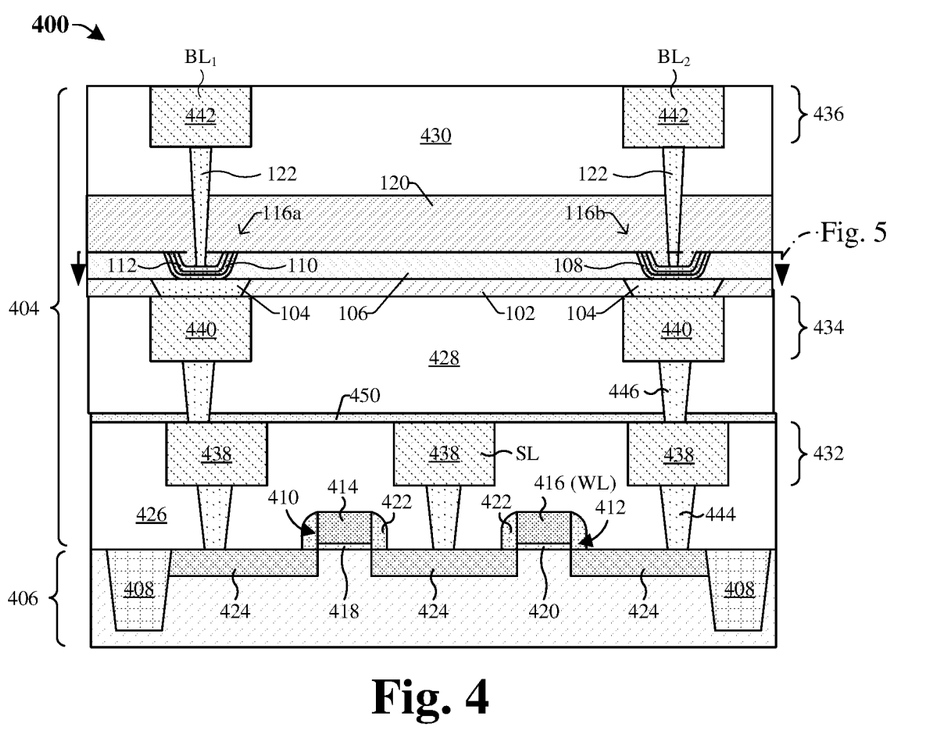
FIG. 4 illustrates a cross-sectional view of some embodiments of a memory device including two programmable metallization cells.

Referring to FIG. 4, a cross-sectional view of some embodiments of an integrated circuit 400, which includes a first memory cell 116a and a second memory cell 116b disposed in an interconnect structure 404 of the integrated circuit 400 is provided. The first and second memory cells 116a, 116b are each as the memory cell 116 of FIG. 1 is illustrated and described.

The integrated circuit 400 includes a substrate 406. The substrate 406 may be, for example, a bulk substrate (e.g., a bulk silicon substrate) or a silicon-on-insulator (SOI) substrate. The illustrated embodiment depicts one or more shallow trench isolation (STI) regions 408, which may include a dielectric filled trench within the substrate 406. A cut-line is disposed directly above a top surface of the top electrode 112, a top surface of the data storage layer 110, and a top surface of the bottom electrode 108 of both memory cells 116a, 116b.

Two access transistors 410, 412 are disposed between the STI regions 408. The access transistors 410, 412 include access gate electrodes 414, 416, respectively; access gate dielectrics 418, 420, respectively; access sidewall spacers 422; and source/drain regions 424. The source/drain regions 424 are disposed within the substrate 406 between the access gate electrodes 414, 416 and the STI regions 408, and are doped to have a first conductivity type which is opposite a second conductivity type of a channel region under the access gate dielectrics 418, 420, respectively. The access gate electrodes 414, 416 may be, for example, doped polysilicon or a metal, such as aluminum, copper, or combinations thereof. The access gate dielectrics 418, 420 may be, for example, an oxide, such as silicon dioxide, or a high-k dielectric material. As used herein, a high-k dielectric material is a dielectric material that has a dielectric constant greater than about 3.9. The access sidewall spacers 422 can be made of silicon nitride (e.g., $Si_3N_4$), for example. In some embodiments, the access transistor 410 and/or the access transistor 412 may, for example, be electrically coupled to a word line (WL) such that an appropriate WL voltage can be applied to the access gate electrode 414 and/or the access gate electrode 416.

The interconnect structure 404 is arranged over the substrate 406 and electrically couples devices (e.g., access transistors 410, 412) to one another. The interconnect structure 404 includes a plurality of inter-metal dielectric (IMD) layers 426, 428, 430, and a plurality of metallization layers 432, 434, 436 which are layered over one another in an alternating fashion. The IMD layers 426, 428, 430 may be made, for example of a low-k dielectric layer, or an oxide, such as silicon dioxide. The metallization layers 432, 434, 436 include metal lines 438, 440, 442, which are formed within trenches, and which may be made of a metal such as copper or aluminum. Contacts 444 extend from the bottom metallization layer 432 to the source/drain regions 424 and/or access gate electrodes 414, 416; and vias 446 extend between the metallization layers 432, 434, 436. The vias 446 extend through dielectric-protection layer 450 (which can be made of a dielectric material and can act as an etch stop layer during manufacturing). The dielectric-protection layer 450 made be made of an extreme low-k dielectric material, for example. The contacts 444 and the vias 446 made be made of a metal, such as copper or tungsten, for example. In some embodiments, a metal line in the metal lines 438 may, for example, be electrically coupled to a source line (SL) such that an output of the access transistors 410, 412 may be accessed at the SL.

The first and second memory cells 116a, 116b, which are configured to store respective data states, are arranged within the interconnect structure 404 between neighboring metal layers. The first and second memory cells 116a, 116b respectively include the bottom electrode 108, the data storage layer 110, and the top electrode 112. The first and second memory cells 116a, 116b are respectively electrically coupled to a first bit-line $BL_1$ and a second bit-line $BL_2$ through the metal line 442. In some embodiments, a conductive via is disposed between the bottom conductive wire 104 and the metal line 440 (not shown). In yet further embodiments, a top electrode via is respectively disposed between the first and second memory cells 116a, 116b and the conductive via 122 (not shown).

Figure 5:
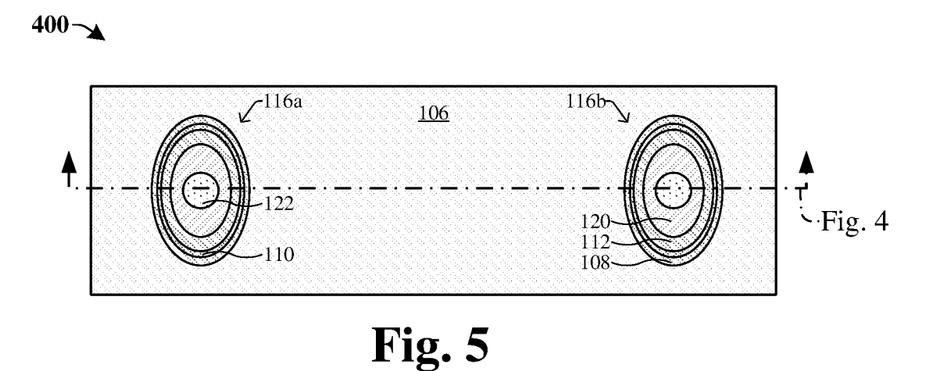
FIG. 5 illustrates a top view of some embodiments of the memory device of FIG. 4, as indicated by the cut-lines in FIGS. 4 and 5.

Referring to FIG. 5, a top view of some embodiments of the integrated circuit 400 of FIG. 4 is provided.

As illustrated in FIG. 5, the first and second memory cells 116a, 116b have a circular/elliptical shape. In some embodiments, when viewed from a top view, the first and second memory cells 116a, 116b may have a square and/or rectangular shape. In other embodiments, however, for example due to partialities of many etch processes, the corners of a square or rectangular shape can become rounded, resulting in the first and second memory cells 116a, 116b respectively having a square or rectangular shape with rounded corners, or having a circular or elliptical shape. The first and second memory cells 116a, 116b are arranged over metal lines (440 of FIG. 4), respectively, and have upper portions in direct electrical connection with the conductive via 122. In some embodiments, an upper portion of the top electrode 112 is directly electrically coupled to a top electrode via disposed between the top electrode 112 and the metal line 442 (not shown).

FIGS. 6-11 illustrate cross-sectional views 600-1100 of some embodiments of a method of forming a memory device including a programmable metallization cell according to the present disclosure. Although the cross-sectional views 600-1100 shown in FIGS. 6-11 are described with reference to a method, it will be appreciated that the structures shown in FIGS. 6-11 are not limited to the method but rather may stand alone separate of the method. Although FIGS. 6-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
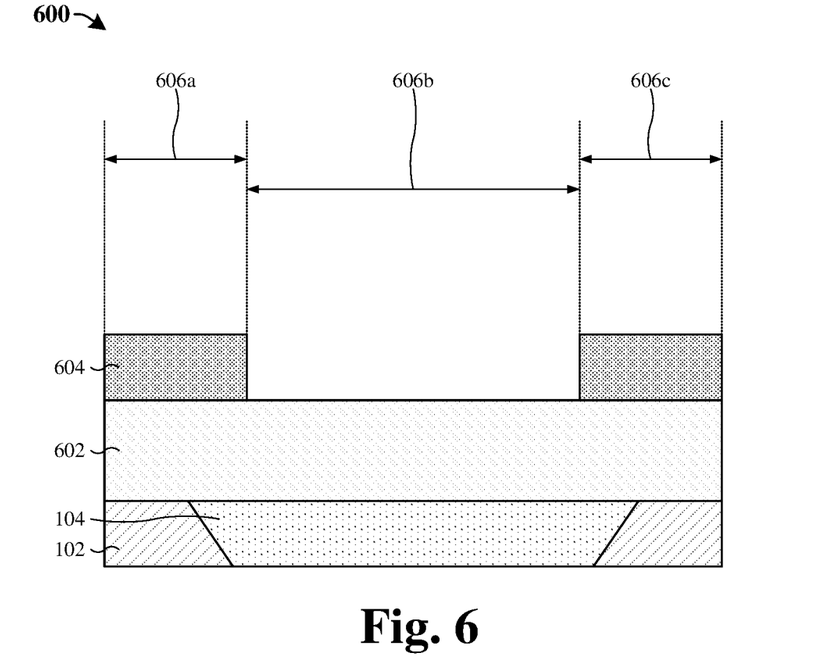
FIGS. 6-11 illustrate cross-sectional views of some embodiments of a method of forming a memory device including a programmable metallization cell.

As shown in cross-sectional view 600 of FIG. 6, a bottom conductive wire 104 is formed within an inter-level dielectric (ILD) layer 102. A dielectric film 602 is formed over the bottom conductive wire 104. In some embodiments, the dielectric film 602 is comprised of one or more dielectric layers and may, for example, be or comprise silicon nitride, silicon carbide, or the like formed to a thickness within a range of about 300 to 1000 Angstroms. A masking layer 604 is formed over the dielectric film 602, such that the masking layer 604 covers outer regions 606a, 606c of the dielectric film 602 and leaves a center region 606b of the dielectric film 602 uncovered and exposed. In some embodiments, the masking layer 604 includes a photoresist mask. In other embodiments, the masking layer 604 comprises a hardmask layer (e.g., comprising a nitride layer). In yet further embodiments, the masking layer 604 may comprise a multi-layer hard mask. In some embodiments, the bottom conductive wire 104 may, for example, be or comprise aluminum, copper, or the like.

Figure 7:
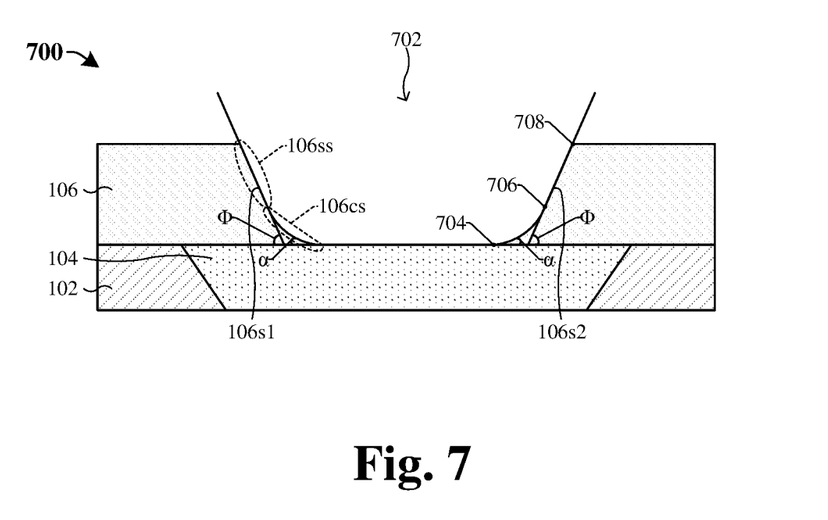

As shown in cross-sectional view 700 of FIG. 7, an etching process is performed to etch the dielectric film (602 of FIG. 6) and form an opening 702 in the dielectric film (602 of FIG. 6), thereby defining a bottom dielectric layer 106. The etching process involves exposing the dielectric film (602 of FIG. 6) within the center region (606b of FIG. 6) to one or more etchants, and subsequently performing a removal process to remove the masking layer (604 of FIG. 6) (not shown). In some embodiments, the etching process may comprise one or more etchants such as difluoromethane (e.g., $CH_2F_2$, $CHF_3$), perfluorocyclobutane ($C_4F_8$), hydrofluoric acid, and/or nitric acid. In further embodiments, the etching process may comprise a dry etch process utilizing first etchants (e.g., difluoromethane (e.g., $CH_2F_2$, $CHF_3$), and/or perfluorocyclobutane ($C_4F_8$)), subsequently followed by a blanket etch back process utilizing second etchants different than the first etchants. In some embodiments, the etching process etches the bottom conductive wire 104, such that an upper surface of the bottom conductive wire 104 is below a bottom surface of the bottom dielectric layer 106 by a distance within a range of approximately 1 to 130 Angstroms (not shown).

In some embodiments, by virtue of the etching process, the bottom dielectric layer 106 has a pair of opposing sidewalls 106s1, 106s2 that respectively comprise a slanted sidewall segment 106ss overlying a curved sidewall segment 106cs. For example, the dry etch process may form the slanted sidewall segment 106ss and the blanket etch back process may form the curved sidewall segment 106cs. In some embodiments, the curved sidewall segment 106cs is defined from a first point 704 (in which an edge of the bottom dielectric layer 106 directly contacts the bottom conductive wire 104) to a second point 706 (in which the second point 706 is below a midpoint of the bottom dielectric layer 106 and above the first point 704 by a non-zero distance). In further embodiments, a slope of a curved surface of the bottom dielectric layer 106 continuously increases while moving along incremental segments of the curved surface from the first point 704 to the second point 706. An angle α defined between the curved surface and the bottom conductive wire 104 may be within a range of about 1 to 60 degrees. In further embodiments, the slanted sidewall segment 106ss is defined from the second point 706 to a third point 708 (defined at an edge of the top surface of the bottom dielectric layer 106). In some embodiments, the slanted sidewall segment 106ss is substantially straight and has an angle Φ from the top surface of the bottom conductive wire 104 to the sidewall 106s2 of the bottom dielectric layer 106. The angle Φ may, for example, be within a range of about 30 to 75 degrees. In further embodiments, a sidewall 106s1 has a slanted sidewall segment 106ss overlying a curved sidewall segment 106cs configured as described above.

Figure 8:
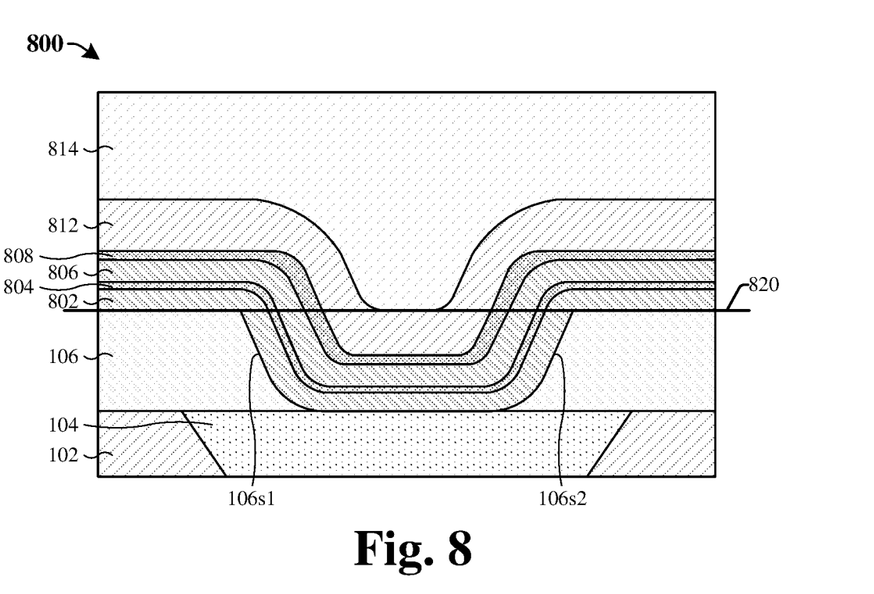

As shown in cross-sectional view 800 of FIG. 8, a bottom electrode layer 802 is formed over the bottom dielectric layer 106. A data storage film 804 is formed over the bottom electrode layer 802. A top electrode layer 806 is formed over the data storage film 804. A conductive barrier film 808 is formed over the top electrode layer 806. A top dielectric film 812 is formed over the conductive barrier film 808. A buffer layer 814 is formed over the top dielectric film 812. In some embodiments, the conductive barrier film 808 is a part of the top electrode layer 806 (such that the top electrode layer 806 comprises a top layer directly overlying a bottom layer). A substantially straight horizontal line 820 is aligned with the top surface of the bottom dielectric layer 106.

In some embodiments, the bottom electrode layer 802 may, for example, be or comprise silver, copper, or the like formed to a thickness within a range of approximately 75 to 300 Angstroms. In some embodiments, the data storage film 804 may, for example, be or comprise metal oxide such as hafnium oxide, aluminum oxide, tantalum oxide, or the like formed to a thickness within a range of approximately 20 to 100 Angstroms. In some embodiments, the top electrode layer 806 may, for example, be or comprise silver, titanium nitride, copper, or the like formed to a thickness within a range of approximately 100 to 600 Angstroms. In some embodiments, the conductive barrier film 808 may, for example, be or comprise titanium nitride, a nitride, tantalum nitride, or the like formed to a thickness within a range of approximately 25 to 250 Angstroms. In some embodiments, the top dielectric film 812 may, for example, be or comprise silicon nitride, silicon carbide, or the like formed to a thickness within a range of approximately 300 to 1500 Angstroms. In yet further embodiments, the top dielectric film 812 may comprise a same material as the bottom dielectric layer 106. In some embodiments, the buffer layer 814 may, for example, be or comprise an oxide such as silicon oxide formed to a thickness within a range of approximately 1000 to 3000 Angstroms.

Figure 9:
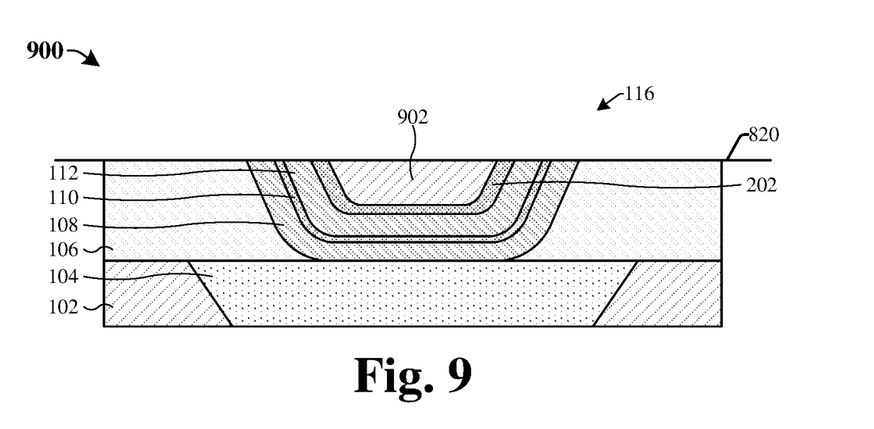

As shown in cross-sectional view 900 of FIG. 9, a planarization process is performed until the top surface of the bottom dielectric layer 106 is reached, thereby defining a memory cell 116. The planarization process removes the buffer layer 814 and removes portions of the bottom electrode layer 802, the data storage film 804, the top electrode layer 806, the conductive barrier film 808, and the top dielectric film 812, thereby defining a bottom electrode 108, a data storage layer 110, a top electrode 112, a conductive barrier layer 202, and a dielectric segment 902, respectively. The memory cell 116 includes the bottom electrode 108, the data storage layer 110, the top electrode 112 and the conductive barrier layer 202. In some embodiments, the planarization process comprises performing a chemical-mechanical planarization (CMP) process along the substantially straight horizontal line 820. In some embodiments, the planarization process comprises one or more slurry for a non-selective CMP. Thus, in some embodiments, the memory cell 116 is formed by, for example, a single CMP process, such that the top and bottom electrode 112, 108 are electrically isolated from one another. Further, in some embodiments after performing the planarization process a cleaning process (e.g., a wet cleaning process utilizing hydrofluoric acid) is performed. In further embodiments, the cleaning process may remove conductive materials extending over the top and bottom electrodes 112, 108 and the data storage layer 110, thereby increasing isolation between the top and bottom electrodes 112, 108. In yet further embodiments, the top electrode 112, the data storage layer 110, the bottom electrode 108 respectively having a U-shaped profile mitigates peeling between the aforementioned layers, thereby increasing a stability and/or endurance of the memory cell 116.

In some embodiments, after performing the planarization process and/or the cleaning process, a pullback etch process is performed. In some embodiments, the pullback etch process utilizes a dry etch (e.g., comprising methane ($CH_4$) and/or hydrogen ($H_2$) etchant(s)) configured to remove a portion of the top electrode 112, conductive barrier layer 202, and/or the bottom electrode 108 (e.g., please refer to FIG. 2B). In further embodiments, the pullback etch process utilizes a dry etch (e.g., comprising a carbon tetrafluoride ($CF_4$) etchant) configured to remove a portion of the data storage layer 110 (e.g., please refer to FIG. 3A). In yet further embodiments, the pullback etch process utilizes a wet etch (e.g., comprising a hydrochloric acid etchant) configured to remove a portion of the top electrode 112, conductive barrier layer 202, and/or the bottom electrode 108 (e.g., please refer to FIG. 2B). In other embodiments, the pullback etch process utilizes a wet etch (e.g., comprising a dihydrofolic acid etchant) configured to remove a portion of the data storage layer 110 (e.g., please refer to FIG. 3A).

Figure 10:
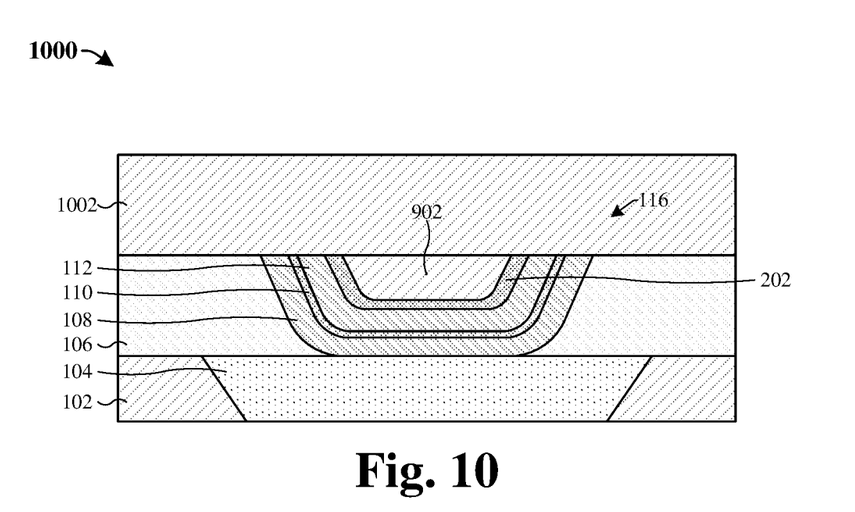

As shown in cross-sectional view 1000 of FIG. 10, a top dielectric film 1002 is formed over the memory cell 116. In some embodiments, the top dielectric film 1002 may comprise a same material as the dielectric segment 902 and/or the bottom dielectric layer 106. In further embodiments, the top dielectric film 1002 may, for example, be or comprise an extreme low-k dielectric material, an oxide such as silicon oxide, or the like formed to a thickness within a range of approximately 300 to 1500 Angstroms.

Figure 11:
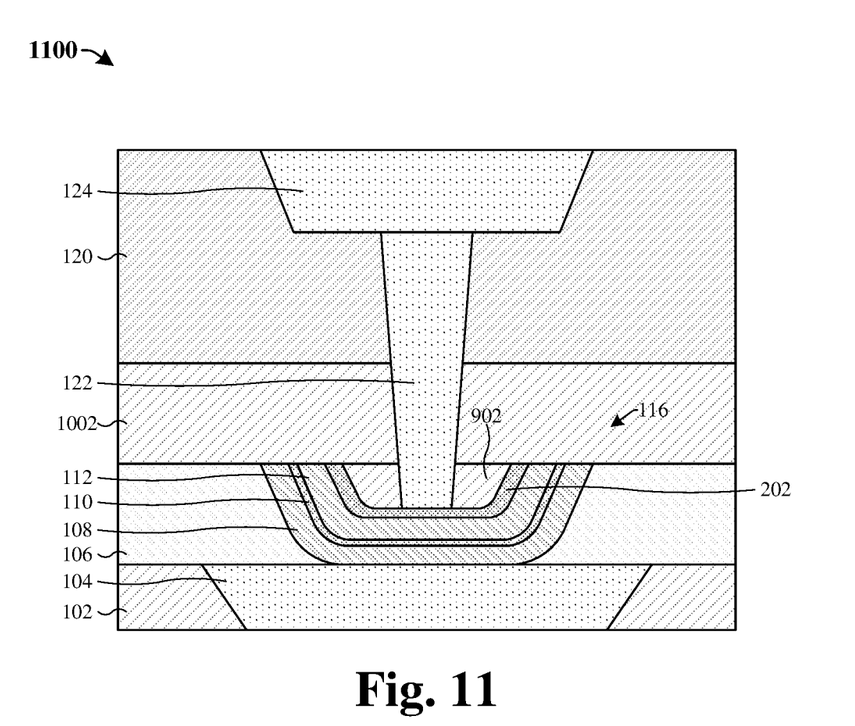

As shown in cross-sectional view 1100 of FIG. 11, an upper inter-level dielectric (ILD) structure 120 is formed over the top dielectric film 1002. In some embodiments, the upper ILD structure 120 may comprise one or more dielectric materials and/or one or more dielectric layers. In further embodiments, the upper ILD structure 120 may, for example, be or comprise an extreme low-k dielectric material, an oxide such as silicon oxide, or the like formed to a thickness within a range of approximately 1250 to 2800 Angstroms. A conductive via 122 is formed over the memory cell 116, such that the conductive via 122 electrically couples the conductive barrier layer 202 to overlying conductive wires. An upper conductive wire 124 is formed over the conductive via 122.

In some embodiments, the conductive via 122 is formed by a single damascene process, and subsequently the upper conductive wire 124 is formed by the single damascene process. In further embodiments, the single damascene process comprises depositing a dielectric layer, patterning the dielectric layer with openings for a single layer of conductive features (e.g., a layer of contacts, vias, or wires), and filling the openings with conductive materials to form the single layer of conductive features. In some embodiments, the conductive via 122 and the upper conductive wire 124 may, for example, be or comprise copper, aluminum, or the like. In yet further embodiments, the conductive via 122, the upper conductive wire 124, the top dielectric film 1002, and the upper ILD structure 120 are a part of an interconnect structure.

Figure 12:
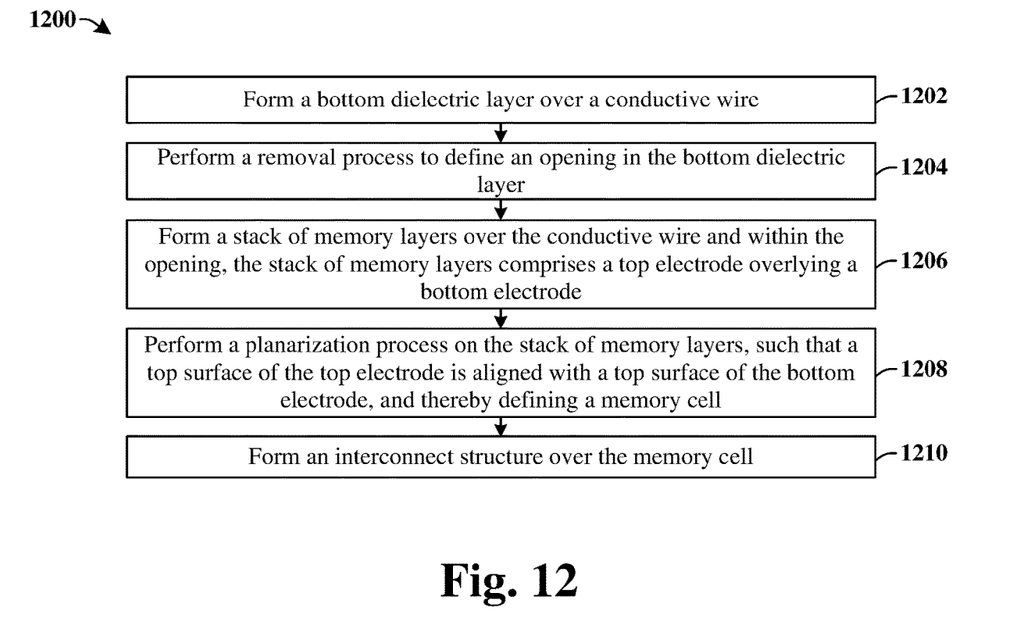
FIG. 12 illustrates a methodology in flowchart format that illustrates some embodiments of a method of forming a memory device including a programmable metallization cell.

FIG. 12 illustrates a method 1200 of forming a memory device in accordance with some embodiments. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, a bottom dielectric layer is formed over a conductive wire. FIG. 6 illustrates a cross-sectional view 600 corresponding to some embodiments of act 1202.

At act 1204, a removal process is performed on the bottom dielectric layer to define an opening in the bottom dielectric layer. FIG. 7 illustrates a cross-sectional view 700 corresponding to some embodiments of act 1204.

At act 1206, a stack of memory layers is formed over the conductive wire and within the opening. The stack of memory layers comprises a top electrode overlying a bottom electrode. FIG. 8 illustrates a cross-sectional view 800 corresponding to some embodiments of act 1206.

At act 1208, a planarization process is performed on the stack of memory layers such that a top surface of the top electrode is aligned with a top surface of the bottom electrode, thereby defining a memory cell. FIG. 9 illustrates a cross-sectional view 900 corresponding to some embodiments of act 1208.

At act 1210, an interconnect structure is formed over the memory cell. FIGS. 10 and 11 illustrates cross-sectional views 1000 and 1100 that correspond to some embodiments of act 1210.

Accordingly, in some embodiments, the present disclosure relates to a method of forming a memory cell comprising a top electrode overlying a bottom electrode with a planarization process (e.g., a single CMP process), such that a top surface of the top electrode is aligned with a top surface of the bottom electrode.

In some embodiments, the present disclosure relates to a memory device including a bottom electrode; a data storage layer overlying the bottom electrode, wherein the bottom electrode cups an underside of the data storage layer; and a top electrode overlying the data storage layer, wherein a top surface of the bottom electrode is aligned with a top surface of the top electrode.

In other embodiments, the present disclosure relates to a programmable metallization cell including a bottom dielectric layer overlying a conductive wire; a bottom electrode disposed within the bottom dielectric layer, wherein the bottom electrode is U-shaped and contacts the conductive wire; a data storage layer overlying the bottom electrode, wherein the data storage layer is U-shaped, such that an upper surface of the bottom electrode continuously extends along a lower surface of the data storage layer; and a top electrode overlying the data storage layer.

In further embodiments, the present disclosure relates to a method for manufacturing a memory device. The method including forming a bottom dielectric layer over a conductive wire; patterning the bottom dielectric layer to form an opening above the conductive wire, wherein the opening has a curved sidewall such that a width of the opening continuously increases from a bottom surface of the bottom dielectric layer to a top surface of the bottom dielectric layer; forming a stack of memory layers over the conductive wire and within the opening, wherein the stack of memory layers comprise a top electrode overlying a bottom electrode; and performing a planarization process on the stack of memory layers, such that a top surface of the top electrode is aligned with a top surface of the bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:
    forming a lower dielectric layer over a conductive wire;
    forming a stack of memory layers within the lower dielectric layer and over the conductive wire, wherein the stack of memory layers comprises a top electrode, a bottom electrode, and a data storage layer between the top electrode and the bottom electrode; and
    performing a removal process on the stack of memory layers to define a programmable metallization cell that comprises the top electrode, the bottom electrode, and the data storage layer, wherein the programmable metallization cell comprises a central region and a peripheral region that extends upwardly from the central region, wherein a top surface of the programmable metallization cell and a top surface of the lower dielectric layer are coplanar, and wherein the removal process includes performing a planarization process into the stack of memory layers and performing a first etch process on the programmable metallization cell after the planarization process.

2. The method of claim 1, wherein the planarization process comprises one or more slurry for a non-selective chemical-mechanical planarization.

3. The method of claim 1, wherein the first etch process comprises performing a wet etch process.

4. The method of claim 1, wherein the removal process further comprises performing a pullback etch process after the first etch process, wherein the first etch process utilizes one or more first etchants and the pullback etch process utilizes one or more second etchants different from the one or more first etchants.

5. The method of claim 4, wherein the pullback etch process removes portions of the top and bottom electrodes such that top surfaces of the top and bottom electrodes are below the top surface of the lower dielectric layer.

6. The method of claim 1, wherein a thickness of the data storage layer is less than a thickness of the bottom electrode and a thickness of the top electrode.

7. The method of claim 6, wherein the thickness of the top electrode is greater than the thickness of the bottom electrode.

8. A method for forming a memory device, the method comprising:
depositing a lower dielectric layer over a conductive wire;
performing a patterning process on the lower dielectric layer to form an opening in the lower dielectric layer that exposes an upper surface of the conductive wire, wherein the patterning process forms a pair of opposing sidewalls in the lower dielectric layer, wherein the pair of opposing sidewalls respectively comprise a slanted sidewall segment vertically above a curved sidewall segment, wherein the patterning process comprises performing a first etch process to form the slanted sidewall segment and a second etch process to form the curved sidewall segment, wherein the first etch process is different from the second etch process;
depositing a stack of memory layers over the conductive wire and within the opening, wherein the stack of memory layers comprises a bottom electrode layer, a top electrode layer, and a data storage film between the bottom electrode layer and the top electrode layer, wherein the stack of memory layers conforms to the pair of opposing sidewalls of the lower dielectric layer; and
performing a planarization process on the stack of memory layers to remove portions of the bottom electrode layer, the top electrode layer, and the data storage film from over the lower dielectric layer, wherein the planarization process defines a memory cell comprising a top electrode, a bottom electrode, and a data storage layer in the opening.

9. The method of claim 8, wherein the planarization process includes performing a single chemical-mechanical planarization (CMP) process to define the memory cell.

10. The method of claim 8, wherein the patterning process etches the conductive wire such that the upper surface of the conductive wire is vertically below a bottom surface of the lower dielectric layer by a non-zero distance.

11. The method of claim 10, wherein a bottom surface of the memory cell contacts the upper surface of the conductive wire.

12. The method of claim 8, further comprising:
performing a pullback etch process on the top and bottom electrodes, wherein top surfaces of the top and bottom electrodes are below a top surface of the data storage layer.

13. A method for manufacturing a memory device, comprising:
forming a bottom dielectric layer over a conductive wire;
patterning the bottom dielectric layer to form an opening above the conductive wire, wherein the opening has a curved sidewall such that a width of the opening continuously increases from a bottom surface of the bottom dielectric layer to a top surface of the bottom dielectric layer;
forming a stack of memory layers over the conductive wire and within the opening, wherein the stack of memory layers comprises a top electrode overlying a bottom electrode and a data storage layer between the top electrode and the bottom electrode, wherein a thickness of the data storage layer is less than a thickness of the top electrode and a thickness of the bottom electrode; and
performing a planarization process on the stack of memory layers, such that a top surface of the top electrode is level with a top surface of the bottom electrode, wherein the patterning comprises performing an etch process and the planarization process comprises performing a chemical-mechanical planarization process.

14. The method of claim 13, wherein the stack of memory layers comprises a center region overlying and conformally lining the opening, such that the stack of memory layers comprises an outer region overlying the top surface of the bottom dielectric layer, wherein the outer region is vertically above the center region.

15. The method of claim 13, wherein the patterning removes a portion of the conductive wire, such that the stack of memory layers extends below the bottom surface of the bottom dielectric layer.

16. The method of claim 12, wherein a height of an upper segment of the data storage layer extending above the top surface of the top electrode is greater than a thickness of the data storage layer.

17. The method of claim 16, further comprising:
forming a dielectric layer over the memory cell, wherein the dielectric layer is continuous along and contacts a top surface and opposing sidewalls of the upper segment of the data storage layer.

18. The method of claim 8, wherein the first etch process utilizes one or more first etchants and the second etch process utilizes one or more second etchants different from the one or more first etchants.

19. The method of claim 13, further comprising:
performing another etch process on the stack of memory layers after the planarization process, thereby reducing a height of the top electrode and/or a height of the bottom electrode.

20. The method of claim 13, further comprising:
forming a conductive via over the top electrode, wherein a bottom surface of the conductive via is below the top surface of the bottom electrode.

* * * * *